US012581710B2

(12) United States Patent
Fukui

(10) Patent No.: US 12,581,710 B2
(45) Date of Patent: Mar. 17, 2026

(54) MANUFACTURING METHOD OF PATTERNING SUBSTRATE, PATTERNED SUBSTRATE, AND INTERMEDIATE PATTERNED SUBSTRATE

(71) Applicants: Mitsubishi Chemical Corporation, Tokyo (JP); GELEST, INC., Morrisville, PA (US)

(72) Inventor: Hiroshi Fukui, Tokyo (JP)

(73) Assignees: MITSUBISHI CHEMICAL CORPORATION, Tokyo (JP); GELEST, INC., Morrisville, PA (US)

( * ) Notice: Subject to any disclaimer, the term of this patent is extended or adjusted under 35 U.S.C. 154(b) by 462 days.

(21) Appl. No.: 18/453,817

(22) Filed: Aug. 22, 2023

(65) Prior Publication Data

US 2024/0072127 A1 Feb. 29, 2024

(30) Foreign Application Priority Data

Aug. 26, 2022 (JP) .................................. 2022-135174

(51) Int. Cl.
*H10D 64/01* (2025.01)
*H01L 21/027* (2006.01)
(Continued)

(52) U.S. Cl.
CPC ......... *H10D 64/01* (2025.01); *H01L 21/0272* (2013.01); *H01L 21/31122* (2013.01);
(Continued)

(58) Field of Classification Search
CPC ................ H10D 64/01; H01L 21/0272; H01L 21/31122; H01L 21/31138
See application file for complete search history.

(56) References Cited

U.S. PATENT DOCUMENTS 9,806,156 B2 10/2017 Mitsuhashi et al.
10,732,505 B1 8/2020 Meyers et al.
(Continued)

FOREIGN PATENT DOCUMENTS

CA 3231519 A1 * 3/2023 ........... G03F 7/2004
CN 102646633 A * 8/2012 ........... H10D 86/441
(Continued)

OTHER PUBLICATIONS

Office Action issued Oct. 7, 2025 in JP Application No. 2022135174 (English machine translation).

*Primary Examiner* — Laura M Menz
(74) *Attorney, Agent, or Firm* — Panitch Schwarze Belisario & Nadel LLP

(57) ABSTRACT

An excellent method of manufacturing a patterned substrate which is capable of easily patterning an insulation layer to provide a patterned substrate even when a difficult-to-etch material is used for the insulation layer, a patterned substrate obtained thereby, and a patterned substrate intermediate thereof are provided. The method of manufacturing a patterned substrate with the insulation layer and an electrode layer stacked in this order on a substrate comprising: forming an organic resist material layer; irradiating the organic resist material layer with radiation or an electromagnetic wave of a wavelength of 10 to 780 nm and developing the organic resist material layer to form a first patterning layer; and removing the first patterning layer.

22 Claims, 4 Drawing Sheets

(51) Int. Cl.
   *H01L 21/311* (2006.01)
   *H01L 21/3213* (2006.01)
   *G03F 7/004* (2006.01)

(52) U.S. Cl.
   CPC .. *H01L 21/31138* (2013.01); *H01L 21/31144*
   (2013.01); *H01L 21/32135* (2013.01); *H01L*
   *21/32139* (2013.01); *G03F 7/0042* (2013.01)

(56) References Cited

U.S. PATENT DOCUMENTS

| | | | | |
|---|---|---|---|---|
| 10,802,399 B2 * | 10/2020 | Nishio | ............... | G03F 7/0392 |
| 11,079,682 B1 * | 8/2021 | Han | ............... | H01L 21/0337 |
| 11,459,656 B1 * | 10/2022 | Arkles | ............... | C07F 7/2284 |
| 11,981,814 B2 * | 5/2024 | Fukui | ............... | B32B 7/06 |
| 12,474,638 B2 * | 11/2025 | Tan | ............... | G03F 1/22 |
| 12,474,640 B2 * | 11/2025 | Lee | ............... | H01J 37/32816 |
| 2011/0189859 A1 * | 8/2011 | Shih | ............... | H01L 21/3081 |
| | | | | 438/703 |
| 2013/0134425 A1 * | 5/2013 | Chung | ............... | H01L 21/28008 |
| | | | | 257/E29.294 |
| 2017/0148880 A1 | 5/2017 | Mitsuhashi et al. | | |
| 2019/0204736 A1 * | 7/2019 | Marumo | ............... | G03F 7/11 |
| 2020/0277492 A1 * | 9/2020 | Fukui | ............... | C09J 7/29 |
| 2020/0393756 A1 * | 12/2020 | Kato | ............... | G03F 7/0397 |
| 2021/0033974 A1 | 2/2021 | Singh et al. | | |
| 2021/0225903 A1 * | 7/2021 | Du | ............... | H10D 86/0231 |
| 2022/0244645 A1 | 8/2022 | Tan et al. | | |
| 2023/0019681 A1 * | 1/2023 | Hatakeyama | ......... | G03F 7/0045 |
| 2023/0095666 A1 * | 3/2023 | Arkles | ............... | G03F 7/11 |
| | | | | 427/255.39 |
| 2023/0279546 A1 * | 9/2023 | Arkles | ............... | G03F 7/2004 |
| 2024/0072127 A1 * | 2/2024 | Fukui | ............... | H01L 21/31138 |
| 2024/0270764 A1 * | 8/2024 | Fukui | ............... | C07F 7/2296 |
| 2024/0280176 A1 * | 8/2024 | Uehara | ............... | B01J 31/12 |
| 2025/0060673 A1 * | 2/2025 | Wu | ............... | G03F 7/36 |
| 2025/0155798 A1 * | 5/2025 | Hioki | ............... | C07F 7/2224 |
| 2025/0179100 A1 * | 6/2025 | Hioki | ............... | G03F 7/0048 |
| 2025/0244678 A1 * | 7/2025 | Lee | ............... | G03F 1/22 |
| 2025/0291255 A1 * | 9/2025 | Lee | ............... | G03F 7/0043 |

FOREIGN PATENT DOCUMENTS

| | | | | | |
|---|---|---|---|---|---|
| CN | 103141159 | A | * | 6/2013 | ............... H05B 45/46 |
| CN | 103141159 | B | * | 4/2015 | ............... H05B 47/20 |
| CN | 108603048 | A | * | 9/2018 | ............... C09D 201/06 |
| CN | 108603048 | B | * | 6/2020 | ............... C08F 257/02 |
| CN | 111247183 | A | * | 6/2020 | ............... C08K 5/0025 |
| CN | 118043496 | A | * | 5/2024 | ............... G03F 7/2004 |
| CN | 118393812 | A | * | 7/2024 | ............... H01L 21/0274 |
| CN | 118393812 | B | * | 8/2024 | ............... H01L 21/0274 |
| CN | 118696148 | A | * | 9/2024 | ............... G03F 7/0042 |
| CN | 119504880 | A | * | 2/2025 | ............... C07F 7/30 |
| EP | 3683246 | A1 | * | 7/2020 | ............... C08G 77/12 |
| JP | S5750466 | A | | 3/1982 | |
| JP | H11308015 | A | | 11/1999 | |
| JP | 2008091555 | A | | 4/2008 | |
| JP | 2012203061 | A | * | 10/2012 | |
| JP | 2017087513 | A | | 5/2017 | |
| JP | 6267951 | B2 | * | 1/2018 | ............... G03F 7/0233 |
| JP | 2019500490 | A | | 1/2019 | |
| JP | 2022008336 | A | * | 1/2022 | ............... H10D 30/673 |
| JP | 7030234 | B2 | * | 3/2022 | ............... H10D 30/673 |
| JP | 2024031537 | A | * | 3/2024 | ............... H10D 64/691 |
| JP | 2024055016 | A | * | 4/2024 | |
| JP | 2025500209 | A | * | 1/2025 | ............... H01L 21/0274 |
| JP | 7668376 | B2 | * | 4/2025 | ............... C09K 11/02 |
| JP | 2025058722 | A | * | 4/2025 | |
| JP | 2025517613 | A | * | 6/2025 | ............... G03F 7/70033 |
| KR | 20010007194 | A | * | 1/2001 | ............... G03F 7/70397 |
| KR | 20110013819 | A | * | 2/2011 | ............... C08G 8/10 |
| KR | 102065294 | B1 | * | 1/2020 | ............... C08K 5/521 |
| KR | 102065299 | B1 | * | 1/2020 | ............... C08J 9/04 |
| KR | 102190353 | B1 | * | 12/2020 | ............... C09D 5/00 |
| KR | 102237652 | B1 | * | 4/2021 | ............... E04B 1/942 |
| KR | 20210088449 | A | * | 7/2021 | ............... B32B 5/022 |
| KR | 20210088450 | A | * | 7/2021 | ............... B32B 15/20 |
| KR | 20220031647 | A | * | 3/2022 | ............... G03F 7/70033 |
| KR | 20240049398 | A | * | 4/2024 | ............... G03F 7/2004 |
| KR | 20240114785 | A | * | 7/2024 | ............... H01L 21/0274 |
| KR | 20240167939 | A | * | 11/2024 | ............... H01L 21/0337 |
| KR | 20250003664 | A | * | 1/2025 | ............... G03F 7/70033 |
| KR | 20250006116 | A | * | 1/2025 | ............... H01L 21/31144 |
| KR | 20250025005 | A | * | 2/2025 | ............... G03F 7/36 |
| KR | 20250034920 | A | * | 3/2025 | ............... G03F 7/405 |
| KR | 102792681 | B1 | * | 4/2025 | ............... H01L 21/0337 |
| KR | 20250069677 | A | * | 5/2025 | ............... G03F 7/405 |
| KR | 102883380 | B1 | * | 11/2025 | ............... G03F 7/2004 |
| WO | WO-2015005051 | A1 | * | 1/2015 | ............... H10D 62/83 |
| WO | WO-2019049950 | A1 | * | 3/2019 | ............... C08F 299/08 |
| WO | WO-2023038651 | A1 | * | 3/2023 | ............... G03F 7/2004 |
| WO | WO-2023115023 | A1 | * | 6/2023 | ............... H01L 21/0274 |
| WO | WO-2023215136 | A1 | * | 11/2023 | ............... G03F 7/70033 |
| WO | WO-2024076481 | A1 | * | 4/2024 | ............... G03F 7/0042 |
| WO | WO-2024196643 | A1 | * | 9/2024 | ............... H01L 21/31144 |
| WO | WO-2025024818 | A1 | * | 1/2025 | ............... G03F 7/405 |
| WO | WO-2025054307 | A2 | * | 3/2025 | ............... C07F 7/2224 |
| WO | WO-2025106274 | A1 | * | 5/2025 | ............... G03F 7/0042 |
| WO | WO-2025170981 | A2 | * | 8/2025 | ............... C07F 7/2284 |
| WO | WO-2025184058 | A2 | * | 9/2025 | ............... G03F 7/0012 |

\* cited by examiner

FIG.2A
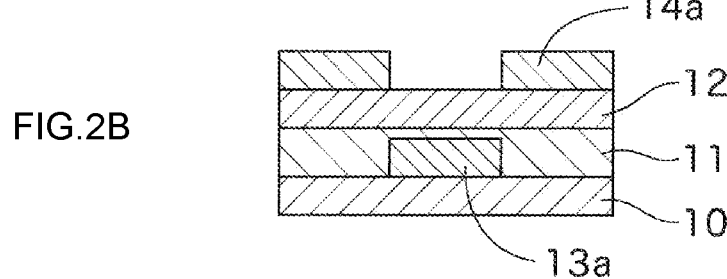
FIG.2B
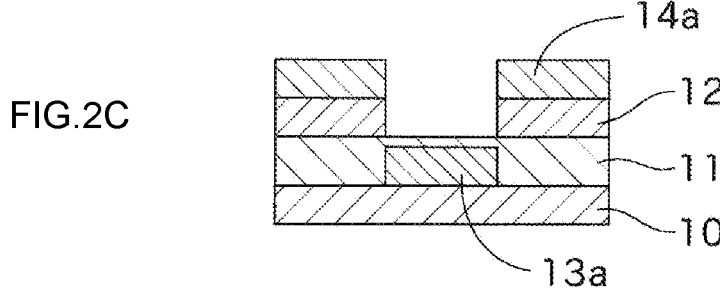
FIG.2C
FIG.2D
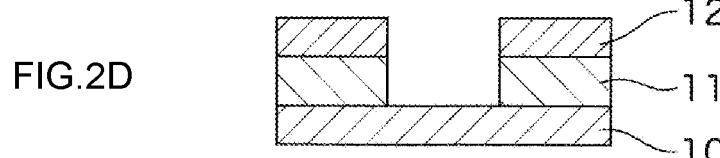

RELATED ART

RELATED ART

MANUFACTURING METHOD OF PATTERNING SUBSTRATE, PATTERNED SUBSTRATE, AND INTERMEDIATE PATTERNED SUBSTRATE

BACKGROUND OF THE INVENTION

Field of the Invention

The present disclosure relates to a method of manufacturing a patterned substrate for use in various semiconductor devices, a patterned substrate obtained thereby, and a patterned substrate intermediate used for obtaining the patterned substrate.

Description of the Related Art

In recent years, there has been a need to handle a greater amount of information at higher speeds with higher precision against the backdrop of a paradigm shift to an advanced information society, and technologies related to semiconductor devices such as integrated circuits using semiconductors have been advancing noticeably day by day.

A manufacturing process for such a semiconductor device is described below, using a very simple schematic view of a MOS device as an example. First, as shown in FIG. 3A, a silicon oxide film 2 serving as a gate insulation layer is formed on a silicon substrate 1 by using thermal oxidation or the like. Then, as shown in FIG. 3B, a polysilicon film 3 serving as a gate electrode is formed on the silicon oxide film 2 by using a CVD (chemical vapor deposition) method or the like.

Subsequently, as shown in FIGS. 3C and 3D, the polysilicon film 3 is covered with a photoresist layer 4, which in turn is formed into a desired mask by lithography. Then, mask patterning of the polysilicon film 3 serving as the gate electrode is performed by exposure and development using the mask. As shown in FIGS. 4A and 4B, using the patterned photoresist layer 4 as a mask, the polysilicon film 3 and the silicon oxide film 2 are etched, for example, by a RIE (reactive ion etching) method.

Next, the photoresist layer 4 is removed by ashing using oxygen plasma. In this manner, a patterned substrate having an uneven pattern is obtained, as shown in FIG. 4D. Thereafter, interlayer dielectrics formation, patterning, metal embedding, planarization, and the like are repeated to form predetermined interconnect lines and elements, thereby forming a circuit required for the device.

Silicon oxide films are often used as gate insulation layer for use in semiconductor devices using such patterned substrates as in the example. In recent years, the use of metal oxides such as hafnium oxides, hafnium silicate oxynitride, and hafnium aluminate, which are known as "high-κ" materials having higher relative dielectric constants, as the gate insulation layer have been considered to meet the demands for even higher integration and speed of semiconductor devices.

The use of these materials having high relative dielectric constants suppresses gate leakage current. For this reason, these materials are expected to allow further thinning of the gate insulation layer and finer patterns. Some semiconductor devices using such high-κ materials have been proposed (as disclosed, for example, in Japanese Published Patent Application No. 2022-8336).

Patent Literature 1: Japanese Published Patent Application No. 2022-8336

However, the high-κ materials are difficult to etch. It is hence not easy to directly etch and pattern insulation layers made of the high-κ materials, and there is a strong need for the development of a method of efficiently etching the insulation layers made of the high-κ materials.

Japanese Published Patent Application No. 2022-8336 is characterized in that a high-κ material used as a first insulation layer and a typical insulation layer made of silicon oxide or the like used as a second insulation layer are combined into a laminated structure and only the second insulation layer is etched and patterned, whereby the relative dielectric constant of the entire insulation layers is increased. The technique disclosed in Japanese Published Patent Application No. 2022-8336 has not succeeded in patterning the insulation layer itself made of the high-κ material.

SUMMARY

In view of the foregoing, it is therefore an object of the present disclosure to provide an excellent method of manufacturing a patterned substrate which is capable of easily patterning an insulation layer to provide a patterned substrate even when a difficult-to-etch material such as a high-κ material is used for the insulation layer, a patterned substrate obtained thereby, and a patterned substrate intermediate thereof.

In view of the foregoing, the present inventor has found that the insulation layer made of the difficult-to-etch material is efficiently patterned by devising manufacturing steps using an organic resist material layer when patterning the insulation layer on a substrate.

Specifically, the present disclosure has the following aspects.

[1] A method of manufacturing a patterned substrate with an insulation layer and an electrode layer stacked in this order on a substrate, the method comprising: forming a first organic hydroxyoxo tin layer; irradiating the first organic hydroxyoxo tin layer with radiation or an electromagnetic wave of a wavelength of 10 to 780 nm and developing the first organic hydroxyoxo tin layer to form a first patterning layer; forming an insulation layer on a substrate having the first patterning layer so as to cover the first patterning layer; forming an electrode layer on the insulation layer; forming a second organic hydroxyoxo tin layer on the electrode layer; irradiating the second organic hydroxyoxo tin layer with radiation or an electromagnetic wave of a wavelength of 10 to 780 nm and developing the second organic hydroxyoxo tin layer to form a second patterning layer; removing a portion of the electrode layer where the second patterning layer is absent; removing a portion of the first patterning layer where the second patterning layer is absent and a portion of the insulation layer which lies on the first patterning layer; and removing the second patterning layer.

[2] The method according to the aspect [1], wherein the step of forming the first organic hydroxyoxo tin layer and/or the second organic hydroxyoxo tin layer is the step of forming the first organic hydroxyoxo tin layer and/or the second organic hydroxyoxo tin layer using an organic hydroxyoxo tin precursor.

[3] The method according to the aspect [1] or [2], wherein the step of removing the portion of the electrode layer where the second patterning layer is absent, the step of removing the portion of the first patterning layer where the second patterning layer is absent and the portion of the insulation layer which lies on the first patterning layer, and the step of removing the second patterning layer are executed in this order or at the same time.

[4] The method according to the aspect [2] or [3], wherein the organic hydroxyoxo tin precursor is represented by formula (1)

$$RSnX_3 \qquad (1)$$

where R is a hydrocarbon group having 1 to 30 carbon atoms, and X is a hydrolyzable substituent.

[5] The method according to any one of the aspects [1] to [4], wherein the first organic hydroxyoxo tin layer and/or the second organic hydroxyoxo tin layer contains a composition represented by formula (2)

$$R_zSnO_{(2-(z/2)-(x/2))}(OH)_x \qquad (2)$$

where z and x satisfy $0 < z \leq 2$ and $0 < (z+x) \leq 4$.

[6] The method according to any one of the aspects [1] to [5], wherein the development removes an unirradiated portion of the first organic hydroxyoxo tin layer by acid in the step of irradiating the first organic hydroxyoxo tin layer with the radiation or the electromagnetic wave of the wavelength of 10 to 780 nm and developing the first organic hydroxyoxo tin layer to form the first patterning layer.

[7] The method according to the aspect [6], wherein the removal of the unirradiated portion is performed by a gas-phase treatment using an acid gas.

[8] The method according to the aspect [7], wherein the acid gas is hydrogen halide containing no water vapor.

[9] The method according to any one of the aspects [1] to [8], wherein the insulation layer is made of a difficult-to-etch material.

[10] The method according to the aspect [9], wherein the difficult-to-etch material is a high-κ material having a relative dielectric constant κ of not less than 9.

[11] The method according to the aspect [10], wherein the high-κ material having the relative dielectric constant κ of 9 or higher is at least one compound selected from the group consisting of hafnium oxide, hafnium silicate oxynitride, hafnium aluminate, zirconium oxide, tantalum oxide, aluminum zirconium oxide, aluminum oxide, lanthanum oxide, and aluminum silicate.

[12] The method according to any one of the aspects [1] to [11], wherein the development removes an unirradiated portion of the second organic hydroxyoxo tin layer by a gas-phase treatment using an acid gas in the step of irradiating the second organic hydroxyoxo tin layer with the radiation or the electromagnetic wave of the wavelength of 10 to 780 nm and developing the second organic hydroxyoxo tin layer to form the second patterning layer.

[13] The method according to any one of the aspects [1] to [12], wherein the step of removing the portion of the electrode layer where the second patterning layer is absent is executed by a gas-phase treatment using an acid gas.

[14] The method according to any one of the aspects [1] to [13], wherein the step of removing the portion of the first patterning layer where the second patterning layer is absent and the portion of the insulation layer which lies on the first patterning layer is executed by a gas-phase treatment using an acid gas.

[15] The method according to any one of the aspects [1] to [14], wherein the step of removing the second patterning layer is executed by a gas-phase treatment using an acid gas.

[16] The method according to any one of the aspects to [15], wherein the acid gas is hydrogen halide containing no water vapor.

[17] A patterned substrate obtained by a method of manufacturing a patterned substrate as recited in any one of the aspects [1] to [16], comprising: a substrate; an insulation layer having a pattern configuration including a site where a patterning layer is removed; and an electrode layer, the substrate, the insulation layer, and the electrode layer being arranged in this order.

[18] A patterned substrate intermediate for obtaining a patterned substrate as recited in the aspect [17], comprising: a substrate; a first pattering layer on the substrate; and an insulation layer on the substrate in such a configuration as to include the first patterning layer.

[19] The patterned substrate intermediate according to the aspect [18], further comprising an electrode layer on the insulation layer.

[20] The patterned substrate intermediate according to the aspect [19], further comprising a second patterning layer on the electrode layer.

[21] The method according to any one of the aspects [1] to [20], wherein the wavelength of the electromagnetic wave with which the first organic hydroxyoxo tin layer and the second organic hydroxyoxo tin layer are irradiated is in the range of 10 to 360 nm.

[22] The method according to any one of the aspects [1] to [21], wherein the wavelength of the electromagnetic wave with which the first organic hydroxyoxo tin layer and the second organic hydroxyoxo tin layer are irradiated is in the range of 10 to 15 nm.

In the method of manufacturing a patterned substrate according to the present disclosure, the organic resist material layer is used for the patterning of the insulation layer. This allows the efficient patterning of the insulation layer even when the insulation layer is made of a difficult-to-etch material. Also, this method reduces the material costs for the formation of the insulation layer because only a very small amount of the insulation layer is etched away.

In the patterned substrate according to the present disclosure, the insulation layer using the difficult-to-etch material such as the high-κ material is efficiently formed by the manufacturing method of the present disclosure. Thus, the patterned substrate has the advantage of exhibiting excellent electrical properties. Also, the reduction in the amount of difficult-to-etch material used reduces the material costs.

The patterned substrate intermediate according to the present disclosure allows the efficient manufacture of the patterned substrate.

BRIEF DESCRIPTION OF THE DRAWINGS

FIGS. 1A to 1D and FIGS. 2A to 2D are views illustrating manufacturing steps according to a preferred embodiment of the present disclosure.

DESCRIPTION OF THE PREFERRED EMBODIMENTS

The present disclosure will be described in more detail hereinafter based on a preferred embodiment of the present disclosure, but the present disclosure is not limited to the following preferred embodiment.

In the present disclosure, the expression "Y to Z" (Y is any number and Z is any number), unless otherwise specified, means "not less than Y and not greater than Z" and also includes the meaning of "preferably greater than Y" or "preferably less than Z".

Also, the expression "not less than Y" (Y is any number) or "not greater than Z" (Z is any number) includes the meaning of "preferably greater than Y" or "preferably less than Z".

Further, in the present disclosure, "y and/or z (y and z each represent any configuration or component)" means three combinations: y only, z only, and y and z.

A preferred embodiment of the present disclosure relates to a method of manufacturing a patterned substrate in which an insulation layer 11 and an electrode layer 12 are stacked in this order on a substrate 10, as shown, for example, in FIG. 2D. This preferred embodiment will be described step by step with reference to FIGS. 1A to 1D and FIGS. 2A to 2D.

<1. Formation of First Organic Hydroxyoxo Tin Layer>

Figure 1A:
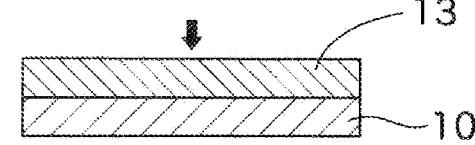

In the present preferred embodiment, a first organic hydroxyoxo tin layer 13 is initially formed as an organic resist material layer on the substrate 10, as shown in FIG. 1A.

The substrate 10 is not particularly limited, but any appropriate material may be used for the substrate 10 depending on the application and required properties of a resulting patterned substrate. Examples of the substrate 10 include substrates made of Si, $SiO_2$, SiN, SiON, SiC, BN, GaN, TiN, BPSG, SOG, Cr, CrO, CrON, and MoSi.

The material of a surface of the substrate 10 (a surface on which the insulation layer 11 is to be formed) need not necessarily be flat and uniform, but part of the surface of the substrate 10 may include a recessed region obtained by removal using etching, for example. On the other hand, part of the surface of the substrate 10 may include a protruding region obtained by addition of other materials by deposition or the like. The thickness of the substrate 10 is not particularly limited, but is set to an appropriate thickness depending on the application and type of the patterned substrate or the like.

In the present disclosure, the organic hydroxyoxo tin layer is used as a resist material, and is irradiated with radiation or an electromagnetic wave of a wavelength of 10 to 780 nm for patterning. The radiation used herein specifically refers to X-rays, gamma rays, electron beams, and the like. The electromagnetic wave of a wavelength of 10 to 780 nm refers to ultraviolet light and visible light. Of these, ultraviolet light of a wavelength of 10 to 360 nm is preferably used, and EUV (extreme ultraviolet) light of a wavelength of 10 to 15 nm is further preferably used. The irradiation with EUV light will be taken as an example for description.

The first organic hydroxyoxo tin layer 13 formed on the substrate 10 is used to assist in patterning by etching of the insulation layer 11 to be formed later than the first organic hydroxyoxo tin layer 13, as will be described later, and is easily patterned by EUV light irradiation and development.

For the formation of the first organic hydroxyoxo tin layer 13, an organic hydroxyoxo tin precursor represented by the general formula "$R_p SnX_m$" is used.

In the formula, "R" is a hydrocarbon group, preferably a hydrocarbon group having 1 to 30 carbon atoms, more preferably 1 to 15 carbon atoms, more preferably 1 to 10 carbon atoms, and further preferably 2 to 6 carbon atoms. Examples of the hydrocarbon group include: saturated hydrocarbon groups such as methyl, ethyl, n-propyl, isopropyl, n-butyl, isobutyl, t-butyl, and 1-methylcyclopentyl groups; and unsaturated hydrocarbon groups such as vinyl and 2-propenyl groups. Of these, hydrocarbon groups with a hydrogen atom at the β-position of the tin atom are preferably used.

In the formula, "X" means a hydrolyzable substituent. Examples of the hydrolyzable substituent include halogen, amino groups, alkoxy groups (—OR'), alkynide ($R'C{\equiv}C$), azide ($N_3$—), dialkylamino groups (—$NR'_2$)(—NR'R"), alkyl carbonyl amino groups (—N(R')C(O)R')(—N(R')C(O)

R")(—N(R")C(O)R'), carbonyloxy groups (—OCOR'), and carbonyl amino groups (—N(H)C(O)R'). R' and R" are each independent hydrocarbon groups having 1 to 10 carbon atoms. Among these, X is preferably a dialkylamino group, an alkoxy group, an alkyl carbonyl amino group, halogen, or a carbonyloxy group. In particular, X is preferably a dialkylamino group or an alkoxy group, and further preferably a dialkylamino group (—$NR'_2$) or an alkoxy group (—OR').

In the formula, it is preferable that "p" is an integer ranging from 1 to 3 and "m" is an integer ranging from 1 to 4. Further preferably, p+m=4, and particularly preferably p=1 and m=3.

The molecular weight of such an organic hydroxyoxo tin precursor is generally in the range of 200 to 900, preferably in the range of 240 to 700, and particularly preferably in the range of 280 to 500.

In the present preferred embodiment, the use of the organic hydroxyoxo tin precursor represented by the general formula (1) described below among the organic hydroxyoxo tin precursors is particularly preferable in effects. In the formula (1) described below, R is a hydrocarbon group, like "R" in the general formula. In particular, it is preferable that the hydrocarbon group has 1 to 15 carbon atoms, more preferably 1 to 10 carbon atoms, and further preferably 2 to 6 carbon atoms. In the formula (1) described below, X is same to "X" in the general formula. Among these, a dialkylamino group, an alkoxy group, an alkyl carbonyl amino group, halogen, or a carbonyloxy group is particularly preferable. In particular, X is preferably a dialkylamino group or an alkoxy group, and further preferably a dialkylamino group (—$NR'_2$) or an alkoxy group (—OR').

$$RSnX_3 \tag{1}$$

where R is a hydrocarbon group having 1 to 30 carbon atoms, and X is a hydrolyzable substituent.

Examples of such an organic hydroxyoxo tin precursor include t-butyltris(dimethylamino)tin, n-butyltris(dimethylamino)tin, t-butyltris(diethylamino)tin, di-t-butylbis(dimethylamino)tin, sec-butyltris(dimethylamino)tin, n-pentyltris(dimethylamino)tin, isobutyltris(dimethylamino)tin, isopropyltris(dimethylamino)tin, t-butyltri-t-butoxy tin, n-butyltri-t-butoxy tin, and isopropyltri-t-butoxy tin.

The organic hydroxyoxo tin precursors may be used either alone or in combination. The formation of a layer using the organic hydroxyoxo tin precursors is not particularly limited, but may be selected as appropriate from various conventionally known film deposition methods such as a spin coating method, a CVD method, a physical vapor deposition method, and an atomic layer deposition method.

In the present preferred embodiment, the use of a CVD method is particularly preferable. The use of the CVD method allows the organic hydroxyoxo tin precursor and an oxygen-containing counter reactant for imparting a hydroxy group to be introduced into a deposition chamber of a CVD apparatus via separate inlets and to be mixed and reacted in a gas phase, thereby forming the first organic hydroxyoxo tin layer 13 on the substrate 10.

The oxygen-containing counter reactant is used in combination with the organic hydroxyoxo tin precursor not only in the CVD method but also in other deposition methods, and performs the function of oxidizing the organic hydroxyoxo tin precursor to produce a large number of hydroxy groups. Examples of the oxygen-containing counter reactant include water, hydrogen peroxide, formic acid, alcohol, oxygen, and ozone, which may be used either alone or in combination.

For the formation of the first organic hydroxyoxo tin layer 13 using the CVD method, the pressure condition during the film deposition is generally in the range of 10 to 1500 Pa, and preferably in the range of 65 to 270 Pa. The temperature of the substrate 10 during the film deposition is generally 0° to 250° C., and preferably 20° to 150° C.

The thickness of the first organic hydroxyoxo tin layer 13 is not particularly limited. However, setting the thickness so that the thickness t1 of a first patterning layer 13a obtained by patterning the first organic hydroxyoxo tin layer 13 is slightly smaller than the thickness t2 of the insulation layer 11 to be formed thereafter is preferable for efficient etching of the insulation layer 11 (with reference to FIG. 1C). It is more effective to set t1/t2=0.7 to 1.

<2. Formation of First Patterning Layer>

Figure 1B:
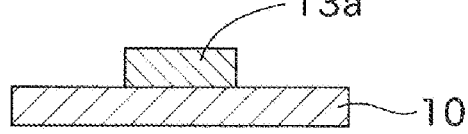

Next, only a specific region of the first organic hydroxyoxo tin layer 13 is irradiated with EUV light and cured, whereby a partial cured pattern layer is formed. Then, development is performed by removing a portion of this partial cured pattern layer which is not irradiated with the EUV light (an uncured portion), whereby the first patterning layer 13a is formed, as shown in FIG. 1B.

The EUV light refers to an electromagnetic wave (Extreme Ultra-Violet) with a wavelength of approximately 10 to 15 nm. The EUV light irradiation causes a large number of terminal hydroxy groups in the first organic hydroxyoxo tin layer 13 to cross-link, thereby forming Sn—O—Sn bonds. As a result, the portion irradiated with the EUV light is cured. Since the unirradiated portion is not cured, the irradiation of only the portion to be patterned with the EUV light forms the partial cured pattern layer of the first organic hydroxyoxo tin layer 13.

High-temperature plasma, especially laser-produced plasma or the like, is used as a light source for the EUV light irradiation. The irradiation dose depends on the thickness of the first patterning layer 13a and the like, but generally 15 to 80 mJ/cm² is preferable.

The development of the first patterning layer 13a is performed by removing the portion unirradiated with the EUV light (the uncured portion) from the partial cured pattern layer before the development. The development is performed using a wet etching process or a dry etching process (gas-phase treatment) with the use of an acid, which is generally performed in an etching process step.

For the development using the wet etching process, examples of a solvent used herein for dissolving and removing the uncured portion of the partial cured pattern layer before the development include isopropyl alcohol, n-butyl alcohol, n-butyl acetate, 2-heptanone, propylene glycol monomethyl ether acetate (PGMEA), propylene glycol monomethyl ether (PGME), and butyl acetate. These may be used either alone or in combination.

For the development using the dry etching process (gas-phase treatment), acidic substances such as hydrogen halide, halogen, diborane, boron trichloride and other Lewis acids, argon, and O₂ and H₂ for improvement in selectivity with silicon are mixed as appropriate, and a gentle plasma treatment (high pressure and low power) or heat treatment is performed while the mixture in a gaseous state flows in contact with the surface of the first patterning layer 13a. The acidic substances may also be used either alone or in combination.

In particular, a plasma dry etching process is preferably used in the present preferred embodiment. When the plasma etching process is used, the plasma process includes conventionally known transformer coupled plasma (TCP), inductively coupled plasma (ICP), capacitively coupled plasma (CCP), electron cyclotron resonance plasma (ECP), and the like. However, high-density plasma other than the CCP is generally used to control the electron density at approximately $10^{10}$ to $10^{13}$/cm³ because ion flux and ion energy are independently uncontrollable in the CCP. The process may be performed preferably at a pressure of not less than 0.6 Pa, more preferably at a pressure of not less than 2 Pa, and preferably at a power level of not greater than 1 kW, more preferably at a power level of not greater than 500 W. The flow rate is preferably 40 to 1000 standard cubic centimeters per minute (sccm). More specifically, the flow rate may be set to approximately 500 sccm preferably in 1 to 3000 seconds, more preferably in 10 to 600 seconds. The temperature may be set preferably at 0° to 300° C., more preferably at 30° to 120° C.

<3. Formation of Insulation Layer>

Figure 1C:
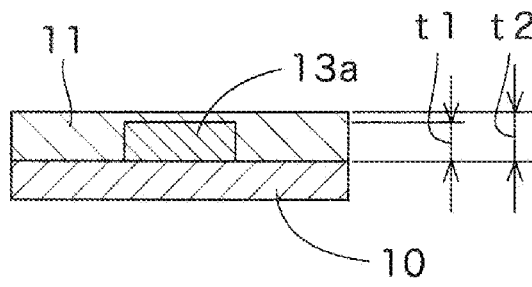

Next, the insulation layer 11 is formed on the substrate 10 having the developed first patterning layer 13a so as to cover the first patterning layer 13a, as shown in FIG. 1C. For efficient etching of the insulation layer 11, setting the thickness t2 of the insulation layer 11 in relation to the thickness t1 of the first patterning layer 13a so as to satisfy t1/t2=0.7 to 1 is preferable as mentioned above, and more preferably t1/t2=0.8 to 0.99.

The insulation layer 11 may be formed using silicon oxide ($SiO_2$) or the like which has conventionally been frequently used for gate insulation layers and the like. Conventionally, insulative materials made of difficult-to-etch materials have been limited in the use for semiconductor devices because of their difficult-to-etch properties in spite of their high relative dielectric constant. It is, however, preferable to use the insulative materials made of the difficult-to-etch materials in the present preferred embodiment because such materials have the advantage of being etchable with efficiency.

Examples of the difficult-to-etch materials having a high relative dielectric constant include high-κ materials having a relative dielectric constant κ of not less than 9. Specific examples thereof include hafnium oxide, hafnium silicate oxynitride, hafnium aluminate, zirconium oxide, tantalum oxide, aluminum zirconium oxide, aluminum oxide, lanthanum oxide, and aluminum silicate. These may be used either alone or in combination.

Among the high-κ materials, hafnium oxide (k is 13 to 18) and zirconium oxide (k is greater than 13) are particularly preferable in the present preferred embodiment because these oxides exhibit especially high relative dielectric constants.

The insulation layer 11 is obtained by depositing an insulative material by using various conventionally known film deposition methods such as a CVD method, an ALD (Atomic Layer Deposition) method, and a sputtering method.

<4. Formation of Electrode Layer>

Figure 1D:
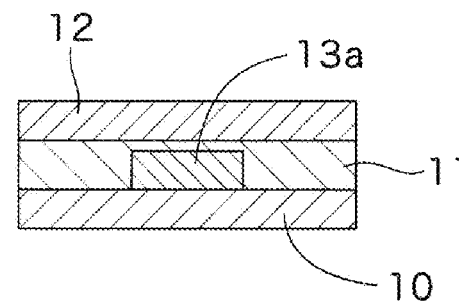
Figure 3A:
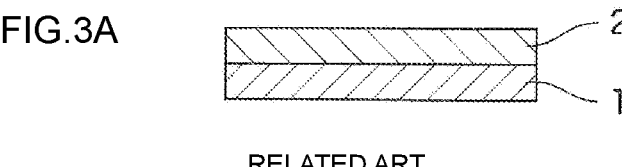
FIGS. 3A to 3D and FIGS. 4A to 4D are views illustrating conventional manufacturing steps of a patterned substrate.
Figure 3B:
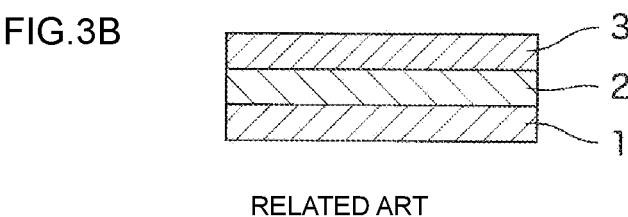
Figure 3C:
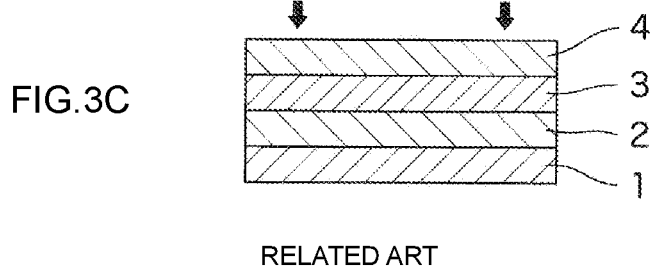
Figure 3D:
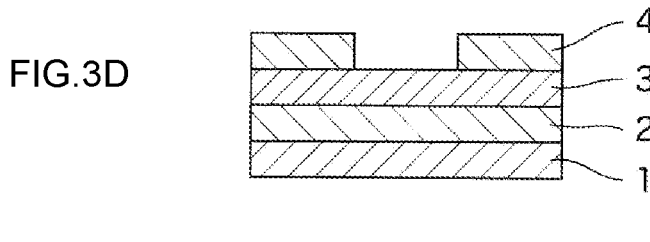
Figure 4A:
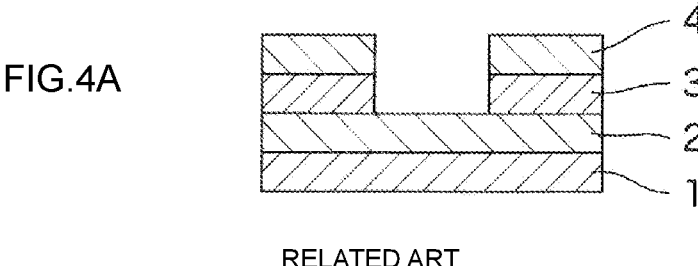
Figure 4B:
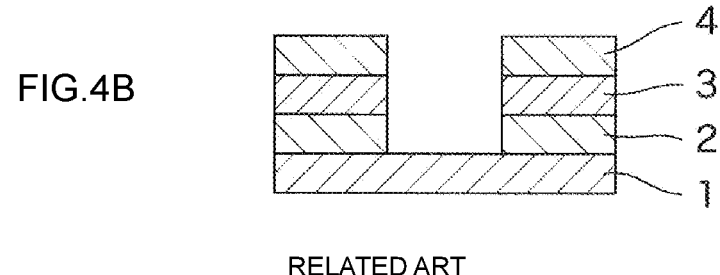
Figure 4C:
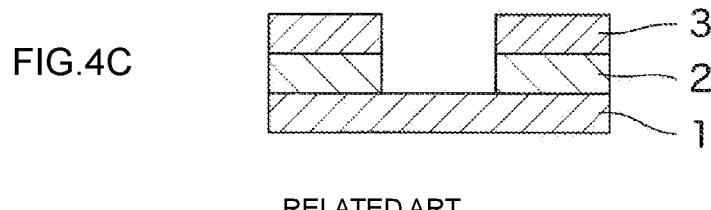
Figure 4D:
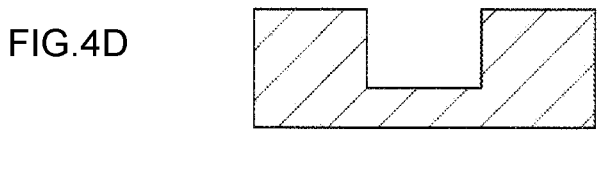

Next, the electrode layer 12 is formed on the insulation layer 11, as shown in FIG. 1D. The electrode layer 12 is obtained by depositing a semiconductive material such as polysilicon by using conventionally known film deposition methods such as a CVD method and a sputtering method.

The thickness of the electrode layer 12 is not particularly limited, but is set to an appropriate thickness depending on the application and required properties of a resulting patterned substrate.

<5. Formation of Second Organic Hydroxyoxo Tin Layer>

Next, a second organic hydroxyoxo tin layer 14 is formed on the electrode layer 12, as shown in FIG. 2A. The second organic hydroxyoxo tin layer 14 is formed using an organic hydroxyoxo tin precursor same to that used for the first organic hydroxyoxo tin layer 13. The second organic hydroxyoxo tin layer 14 and the first organic hydroxyoxo tin layer 13 need not necessarily be made of the same material and need not necessarily be deposited using the same method. However, the second organic hydroxyoxo tin layer 14 and the first organic hydroxyoxo tin layer 13 share the same type of preferred precursor and the same preferred film deposition method, which will not be described.

<6. Formation of Second Patterning Layer>

Next, only a specific region of the second organic hydroxyoxo tin layer 14 is irradiated with EUV light and EUV-cured, whereby a partial cured pattern layer is formed. Then, development is performed by removing a portion of this partial cured pattern layer which is not irradiated with the EUV light (an uncured portion), whereby a second patterning layer 14*a* is formed, as shown in FIG. 2B.

The methods of EUV-curing and development are performed in the same manner as the method of partially curing the specific region of the first organic hydroxyoxo tin layer 13 by the EUV light irradiation to form the partial cured pattern layer and the subsequent method of development.

<7. Patterning of Electrode Layer>

Next, using the second patterning layer 14*a* as a mask, an exposed portion of the electrode layer 12, i.e. a portion of the electrode layer where the second patterning layer 14*a* is absent, is removed, for example, by plasma etching, whereby the electrode layer 12 is patterned, as shown in FIG. 2C.

<8. Removal of Second Patterning Layer>

Then, the developed second patterning layer 14*a* on the electrode layer 12 is removed by dry etching (ashing). The conditions for the dry etching may be same to those for the removal of the first patterning layer 13*a*.

The removal of the second patterning layer 14*a* may be performed following the patterning of the electrode layer 12 or after the removal of the insulation layer 11 to be described below.

<9. Removal of Insulation Layer>

Next, an exposed portion of the insulation layer 11 where the second patterning layer 14*a* and the electrode layer 12 are absent is removed by plasma dry etching. At this time, as shown in FIG. 2C, the first patterning layer 13*a* formed earlier is provided in an overlapping manner under the insulation layer 11. As a result, the insulation layer 11 in this region is very thin. This allows the insulation layer 11 in this region to be efficiently etched away even when the insulation layer 11 is made of a difficult-to-etch material. The conditions for the plasma dry etching are effective when plasma etching is performed while reaction gases are sequentially changed to those corresponding to etching and ashing so that both the insulation layer 11 and the second patterning layer 14*a* (resist layer) are removed. In this case, for example, etching is performed by plasma treatment using boron trichloride ($BCl_3$) to remove the insulation layer 11, and ashing is thereafter performed by plasma treatment using hydrogen halide (HX) or chlorine gas ($Cl_2$). The ashing may be performed using a high concentration of $BCl_3$.

When the etching of the insulation layer 11 and the ashing of the second patterning layer 14*a* (resist) are performed at the same time, the use of an ECR plasma apparatus, for example, and the use of a gas mixture of $BCl_3$ and $Cl_2$ ($Cl_2$ is not greater than 60% by volume) allow the simultaneous etching and ashing.

When the insulation layer 11 is a very thin film, it is not necessary to perform the etching and the ashing stepwise while changing the reaction gases, but the removal of the two layers 11 and 14*a* may be completed in a single step.

<10. Removal of First Patterning Layer on Substrate>

Next, the first patterning layer 13*a* formed on the substrate 10 and exposed by the removal of the insulation layer 11 is removed by dry etching using acid. The dry etching may be performed in the same manner as the removal of the second patterning layer described above.

In this manner, a patterned substrate having a predetermined pattern is obtained in which the insulation layer 11 and the electrode layer 12 are stacked in this order on the substrate 10, as shown in FIG. 2D.

In the method of manufacturing a patterned substrate, the first organic hydroxyoxo tin layer 13 (the first patterning layer 13*a*) is used for the patterning of the insulation layer 11. This allows the efficient patterning of the insulation layer 11 even when the insulation layer 11 is made of a difficult-to-etch material. Also, this method reduces the material costs for the formation of the insulation layer 11 because only a very small amount of the insulation layer 11 is etched away.

In the patterned substrate thus obtained, there is no extra load on the substrate 10 and the electrode layer 12 because the patterning of the insulation layer 11 is performed efficiently in a short time. Thus, the patterned substrate has stable electrical properties.

The efficient manufacture of the patterned substrate which uses a difficult-to-etch material having a high relative dielectric constant κ for the insulation layer 11 provides the patterned substrate particularly excellent in electrical properties.

In the preferred embodiment, the removal of the second patterning layer 14*a* (the eighth step) and the removal of the insulation layer 11 (the ninth step) are performed sequentially stepwise or in a single step. However, depending on the etching conditions, the removal of the second patterning layer 14*a* in the eighth step, the removal of the insulation layer 11 in the ninth step, and the removal of the first patterning layer 13*a* on the substrate 10 in the tenth step may be performed at the same time. In this case, it is preferable to perform plasma treatment using a gas mixture of $BCl_3$ and $Cl_2$, for example, at a high output power of not less than 600 W (an output power higher than that for the "gentle plasma treatment" described above) and under low pressure. Alternatively, $O_2$ and $H_2$ may be mixed in some plasma processes to obtain reaction selectivity with silicon.

In patterning the electrode layer 12, the second patterning layer 14*a* same to the first patterning layer 13*a* used for the patterning of the insulation layer 11 is formed and used as a mask for the etching of the electrode layer 12 in the preferred embodiment. For the patterning of the electrode layer 12, however, the second patterning layer 14*a* need not necessarily be used, but a general patterning method may be used.

However, the use of the first patterning layer 13*a* and the second patterning layer 14*a* in combination as in the preferred embodiment allows the exposed portion of the insulation layer 11 where the patterned electrode layer 12 is absent and the first patterning layer 13*a* under the exposed portion to be removed at the same time, depending on the conditions, when the second patterning layer 14*a* is etched away as mentioned above. This further improves the manufacturing efficiency.

In the preferred embodiment, the organic hydroxyoxo tin layers are used as the organic resist material layers for the formation of the first patterning layer 13*a* and the second patterning layer 14*a*. However, the organic resist material layers need not necessarily be the organic hydroxyoxo tin layers, but any type of organic resist material layer that can be handled in the same manner as in the preferred embodiment may be used. Examples of such an organic resist material layer include organometallic compound resist materials using known metals other than tin, polymer resist materials, and metal oxide resist materials.

In the preferred embodiment, the series of manufacturing steps shown in FIGS. 1A to 1D and FIGS. 2A to 2D are performed sequentially step by step. However, the series of manufacturing steps need not be performed sequentially. A separately produced intermediate may be prepared and processed to obtain a patterned substrate. An example of the intermediate includes a structure in which the first patterning layer 13a is formed on the substrate 10 and the insulation layer 11 is formed on the substrate 10 in such a configuration as to include the first patterning layer 13a (a structure shown in FIG. 1C).

Another example of the intermediate includes a structure in which the electrode layer 12 is formed on the insulation layer 11 (a structure shown in FIG. 1D). Still another example of the intermediate includes a structure in which the second patterning layer 14a is formed on the electrode layer 12 (a structure shown in FIG. 2B).

The use of these patterned substrate intermediates allows the production steps of patterned substrates to be divided according to plant size, facilities, and the like to achieve the efficient manufacture of the patterned substrates.

EXAMPLES

The present disclosure will be described hereinafter in detail using an example. It should be noted that the present disclosure is not limited to the example.

<1. Formation of First Organic Resist Material Layer>

An organic hydroxyoxo tin layer is used as a first organic resist material layer. A silicon substrate having a thickness of 50 μm is prepared as a substrate. A first organic hydroxyoxo tin layer having a thickness of 15 nm is formed on the substrate by a CVD method using isopropyltris(dimethylamino)tin that is a precursor of the organic hydroxyoxo tin layer (with reference to FIG. 1A). The conditions for the CVD method are as follows.

Pressure during film deposition: 133 Pa (1 Torr)
    Temperature during film deposition: 120° C. (wafer stage temperature)

<2. Formation of First Patterning Layer>

Only a specific region of the first organic resist material layer is irradiated with EUV light, so that the specific region of the first organic hydroxyoxo tin layer is cured. This provides a partial cured pattern layer. The EUV light irradiation conditions are as follows.

Light source: EUV light (wavelength of 13.5 nm)
    Irradiation dose: 50 mJ/cm$^2$ Then, an uncured portion of the patterned partially cured layer is removed using a plasma dry etching process, so that a first patterning layer is formed (with reference to FIG. 1B). The etching conditions are as follows.

Etching gas: HCl
    Pressure: 2.6 Pa (20 mTorr)
    Gas flow rate: 200 sccm
    Temperature: 80° C.
    Output power: 400 W <3. Formation of Insulation Layer>

Next, an insulation layer made of hafnium oxide (relative dielectric constant $\kappa$=15) is formed on the substrate having the first patterning layer by an RF (radio frequency) plasma method (with reference to FIG. 1C). The thickness (t2) of the insulation layer is 10 μm, and the thickness (t1) of the first patterning layer is 9.5 μm, so that t1/t2=0.95.

<4. Formation of Electrode Layer>

Next, an electrode layer made of polysilicon and having a thickness of 20 μm is formed on the insulation layer by a CVD method (with reference to FIG. 1D).

<5. Formation of Second Organic Resist Material Layer>

An organic hydroxyoxo tin layer is used as a second organic resist material layer. A second organic hydroxyoxo tin layer having a thickness of 15 nm is formed on the electrode layer by a CVD method using isopropyltris(dimethylamino) tin that is a precursor of the organic hydroxyoxo tin layer (with reference to FIG. 2A). The conditions for the CVD method are as follows.

Pressure during film deposition: 133 Pa (1 Torr)
    Temperature during film deposition: 120° C. (wafer stage temperature)

<6. Formation of Second Patterning Layer>

Next, the second organic hydroxyoxo tin layer is irradiated with EUV light and developed so that a second patterning layer is formed on a portion where the first patterning layer is absent (with reference to FIG. 2B). This provides the second patterning layer.

<7. Patterning of Electrode Layer>

Next, a portion of the electrode layer which is exposed from the second patterning layer is removed by plasma dry etching, whereby the electrode layer is patterned (with reference to FIG. 2C).

<8-10. Removal of Second Patterning Layer, Insulation Layer, and First Patterning Layer>

The three layers, i.e. the second patterning layer, the insulation layer, and the first patterning layer on the substrate, are removed at once by dry etching using an ECR plasma apparatus (with reference to FIG. 2D). The etching conditions are as follows.

Etching gas: a gas mixture of $BCl_3$ and $Cl_2$ ($Cl_2$ is 60% v/v %)
    Pressure: 0.7 Pa (5 mTorr)
    Gas flow rate: 40 sccm
    Electron density: approx. $10^{10}/cm^3$
    Processing time: 60 to 90 seconds
    Temperature: 25° to 60° C.

The example is capable of smoothly etching away the insulation layer although the insulation layer is made of hafnium oxide which is difficult to etch. Thus, this method efficiently provides a patterned substrate using not only the hafnium oxide but also various other difficult-to-etch materials as the insulation layer.

The method of manufacturing a patterned substrate of the present disclosure is useful for manufacturing a patterned substrate which uses a difficult-to-etch material as the insulation layer and which is excellent in electrical properties. The patterned substrate is widely usable for a wide variety of semiconductor devices such as transistors.

Although specific forms in the present disclosure have been described in the example, the example should be considered as merely illustrative and not restrictive. It is contemplated that various modifications evident to those skilled in the art could be made without departing from the scope of the present disclosure.

10 Substrate
    11 Insulation layer
    12 Electrode layer
    13 First organic hydroxyoxo tin layer (organic resist material layer)
    13a First patterning layer.

The invention claimed is:

1. A method of manufacturing a patterned substrate with an insulation layer and an electrode layer stacked in this order on a substrate, the method comprising:

forming a first organic hydroxyoxo tin layer;

irradiating the first organic hydroxyoxo tin layer with radiation or an electromagnetic wave of a wavelength of 10 to 780 nm and developing the first organic hydroxyoxo tin layer to form a first patterning layer;

forming an insulation layer on a substrate having the first patterning layer so as to cover the first patterning layer;

forming an electrode layer on the insulation layer;

forming a second organic hydroxyoxo tin layer on the electrode layer;

irradiating the second organic hydroxyoxo tin layer with radiation or an electromagnetic wave of a wavelength of 10 to 780 nm and developing the second organic hydroxyoxo tin layer to form a second patterning layer;

removing a portion of the electrode layer where the second patterning layer is absent;

removing a portion of the first patterning layer where the second patterning layer is absent and a portion of the insulation layer which lies on the first patterning layer; and removing the second patterning layer.

2. The method according to claim 1, wherein when forming the first organic hydroxyoxo tin layer and/or the second organic hydroxyoxo tin layer is the step of forming the first organic hydroxyoxo tin layer and/or the second organic hydroxyoxo tin layer using an organic hydroxyoxo tin precursor.

3. The method according to claim 1, wherein when removing the portion of the electrode layer where the second patterning layer is absent, the step of removing the portion of the first patterning layer where the second patterning layer is absent and the portion of the insulation layer which lies on the first patterning layer, and the step of removing the second patterning layer are executed in this order or at the same time.

4. The method according to claim 2, wherein the organic hydroxyoxo tin precursor is represented by formula (1)

$$RSnX_3 \qquad (1)$$

where R is a hydrocarbon group having 1 to 30 carbon atoms, and X is a hydrolyzable substituent.

5. The method according to claim 1, wherein the first organic hydroxyoxo tin layer and/or the second organic hydroxyoxo tin layer contains a composition represented by formula (2)

$$R_zSnO_{(2-(z/2)-(x/2))}(OH)_x \qquad (2)$$

where z and x satisfy $0<z\leq2$ and $0<(z+x)\leq4$.

6. The method according to claim 1, wherein the development removes an unirradiated portion of the first organic hydroxyoxo tin layer by acid in when irradiating the first organic hydroxyoxo tin layer with the radiation or the electromagnetic wave of the wavelength of 10 to 780 nm and developing the first organic hydroxyoxo tin layer to form the first patterning layer.

7. The method according to claim 6, wherein the removal of the unirradiated portion is performed by a gas-phase treatment using an acid gas.

8. The method according to claim 7, wherein the acid gas is hydrogen halide containing no water vapor.

9. The method according to claim 1, wherein the insulation layer is made of a difficult-to-etch material.

10. The method according to claim 9, wherein the difficult-to-etch material is a high-κ material having a relative dielectric constant κ of not less than 9.

11. The method according to claim 10, wherein the high-κ material having the relative dielectric constant κ of 9 or higher is at least one compound selected from the group consisting of hafnium oxide, hafnium silicate oxynitride, hafnium aluminate, zirconium oxide, tantalum oxide, aluminum zirconium oxide, aluminum oxide, lanthanum oxide, and aluminum silicate.

12. The method according to claim 1, wherein the development removes an unirradiated portion of the second organic hydroxyoxo tin layer by a gas-phase treatment using an acid gas in the step of irradiating the second organic hydroxyoxo tin layer with the radiation or the electromagnetic wave of the wavelength of 10 to 780 nm and developing the second organic hydroxyoxo tin layer to form the second patterning layer.

13. The method according to claim 1, wherein when removing the portion of the electrode layer where the second patterning layer is absent is executed by a gas-phase treatment using an acid gas.

14. The method according to claim 1, wherein when removing the portion of the first patterning layer where the second patterning layer is absent and the portion of the insulation layer which lies on the first patterning layer is executed by a gas-phase treatment using an acid gas.

15. The method according to claim 1, wherein when removing the second patterning layer is executed by a gas-phase treatment using an acid gas.

16. The method according to claim 12, wherein the acid gas is hydrogen halide containing no water vapor.

17. A patterned substrate obtained by a method of manufacturing a patterned substrate as recited in claim 1, comprising:

a substrate;

an insulation layer having a pattern configuration including a site where a patterning layer is removed; and an electrode layer, the substrate, the insulation layer, and the electrode layer being arranged in this order.

18. A patterned substrate intermediate for obtaining a patterned substrate as recited in claim 17, comprising:

a substrate;

a first pattering layer on the substrate; and an insulation layer on the substrate in such a configuration as to include the first patterning layer.

19. The patterned substrate intermediate according to claim 18, further comprising an electrode layer on the insulation layer.

20. The patterned substrate intermediate according to claim 19, further comprising a second patterning layer on the electrode layer.

21. The method according to claim 1, wherein the wavelength of the electromagnetic wave with which the first organic hydroxyoxo tin layer and the second organic hydroxyoxo tin layer are irradiated is in the range of 10 to 360 nm.

22. The method according to claim 1, wherein the wavelength of the electromagnetic wave with which the first organic hydroxyoxo tin layer and the second organic hydroxyoxo tin layer are irradiated is in the range of 10 to 15 nm.

* * * * *